(12) United States Patent
Hirayama et al.

(10) Patent No.: US 8,227,789 B2
(45) Date of Patent: Jul. 24, 2012

(54) OPTICAL SEMICONDUCTOR DEVICE AND METHOD OF MANUFACTURING THE SAME

(75) Inventors: Hideki Hirayama, Saitama (JP); Tomohiko Shibata, Tokyo (JP)

(73) Assignees: Riken, Saitama (JP); Dowa Electronics Materials Co., Ltd., Tokyo (JP)

( * ) Notice: Subject to any disclaimer, the term of this patent is extended or adjusted under 35 U.S.C. 154(b) by 353 days.

(21) Appl. No.: 12/550,329

(22) Filed: Aug. 28, 2009

(65) Prior Publication Data
US 2010/0219395 A1     Sep. 2, 2010

(30) Foreign Application Priority Data
Feb. 27, 2009   (JP) ................................. 2009-046434

(51) Int. Cl.
*H01L 33/00* (2010.01)
(52) U.S. Cl. ........... 257/13; 257/E33.008; 257/E33.027; 438/47
(58) Field of Classification Search .................... 257/13, 257/14, E33.008, E33.027
See application file for complete search history.

(56) References Cited

U.S. PATENT DOCUMENTS

| 5,990,495 | A | 11/1999 | Ohba | |
|---|---|---|---|---|
| 7,745,841 | B2* | 6/2010 | Kuramoto | 257/96 |
| 2009/0050874 | A1* | 2/2009 | Kim et al. | 257/13 |
| 2011/0147763 | A1* | 6/2011 | Hanawa et al. | 257/76 |

FOREIGN PATENT DOCUMENTS
JP     9-64477     3/1997

OTHER PUBLICATIONS

Hirayama, H. et al., "CW 11mV output operation of 264 nm deep-UV ALGaN quantum well LED," Extended Abstracts (The 69th Autumn Meeting, 2008); The Japan Society of Applied Physics No. 1, Abstract No. 5p-CA-5, (Sep. 2, 2008), 4 pages.
English language translation of: Hirayama, H. et al., "CW 11mV output operation of 264 nm deep-UV ALGaN quantum well LED," Extended Abstracts (The 69th Autumn Meeting, 2008); The Japan Society of Applied Physics No. 1, Abstract No. 5p-CA-5, (Sep. 2, 2008), 3 pages.
Noguchi, N. et al., "Toward high-power operation of 230 nm-band AlGaN UV-LED," IEICE Technical Report vol. 108, No. 321, ED2008-167, pp. 71-76 (Nov. 20, 2008), 10 pages.
English language translation of: Noguchi, N. et al., "Toward high-power operation of 230 nm-band AlGaN UV-LED," IEICE Technical Report vol. 108, No. 321, ED2008-167, pp. 71-76 (Nov. 20, 2008), 15 pages.
Noguchi, N. et al., "230 nm-band CW Single-peaked operation of deep-UV AlGaN MQW LED with AlN electron blocking layer," Extended Abstracts (The 69th Autumn Meeting, 2008); The Japan Society of Applied Physics No. 1, Abstract No. 5p-CA-6 (Sep. 2, 2008), 4 pages.
English language translation of: Noguichi, N. et al., "230 nm-band CW Single-peaked operation of deep-UV AlGaN MQW LED with AlN electron blocking layer," Extended Abstracts (The 69th Autumn Meeting, 2008); The Japan Society of Applied Physics No. 1, Abstract No. 5p-CA-6 (Sep. 2, 2008), 3 pages.

* cited by examiner

*Primary Examiner* — Zandra Smith
*Assistant Examiner* — Paul Patton
(74) *Attorney, Agent, or Firm* — Fish & Richardson P.C.

(57) ABSTRACT

Devices and techniques related to UV light-emitting devices that can be implemented in ways that improve the light-emitting efficiency of an UV light-emitting device using a group III nitride semiconductor.

29 Claims, 12 Drawing Sheets

Deep UV LED (230-350nm)

Deep UV semiconductor laser (270-340nm)

OPTICAL SEMICONDUCTOR DEVICE AND METHOD OF MANUFACTURING THE SAME

CROSS-REFERENCE TO RELATED APPLICATIONS

This application claims priority to Japanese Patent Application No. 2009-046434 entitled "OPTICAL SEMICONDUCTOR DEVICE AND METHOD OF MANUFACTURING THE SAME" and filed on Feb. 27, 2009. The disclosure of the prior application is considered part of and is incorporated by reference in the disclosure of this application.

BACKGROUND

This application relates to optical semiconductor devices and methods of manufacturing such optical semiconductor devices, including light-emitting devices.

In recent years, nitride semiconductors containing nitrogen as a group V element have been in the limelight in the field of semiconductor light-emitting devices utilizing pn junction, such as light-emitting diodes and laser diodes, and have been researched and developed. The nitride semiconductors such as AN, GaN, and InN are direct gap semiconductors. Moreover, nitride semiconductors of ternary mixed crystal type or quaternary mixed crystal type can emit light from infrared light to deep UV light by appropriately setting composition to vary a band gap (a band gap Eg can be varied from 0.75 eV to 6.2 eV).

Furthermore, a semiconductor light-emitting device which uses an AlGaInN quaternary mixed crystal as a material for a light-emitting layer and emits light in an UV region has received attention as exemplified by the disclosure of Japanese Patent Application Publication No. Hei 9-64477. Although an AlGaInN layer includes In, an emission peak wavelength can be set in a wavelength band of 360 nm or less and reportedly, its internal quantum efficiency can be improved to a similar extent to that of an InGaN layer.

SUMMARY

In some nitride UV LED devices as light-emitting devices, the external quantum efficiency can be 5% or less, and 2% or less especially in the wavelength of 300 nm or less suitable for the sterilizing effect, which is disadvantageously unpractical.

The devices and techniques described in this application can be implemented in ways that improve the light-emitting efficiency of an UV light-emitting device using a group III nitride semiconductor.

In one aspect, this application provides a light-emitting device formed on an AlN-based group III nitride single crystal including: a high-concentration n-type group III nitride layer; a multi quantum well structure formed of an n-type or i-type group III nitride barrier layer and an n-type or i-type group III nitride well layer; an i-type group III nitride final barrier layer; a p-type group III nitride layer; and an electron blocking layer formed between the i-type group III nitride final barrier layer and the p-type group III nitride layer, the electron blocking layer being formed of a p-type or i-type $Al_zGa_{1-z}N$ layer ($0.95 < z \leq 1$) serving as an energy barrier for electrons in the i-type group III nitride final barrier layer. Basically, the layers are grown from a substrate in series.

More specifically, provided is a light-emitting device formed on an AlN-based group III nitride single crystal including: a high-concentration n-type AlGaN layer; a multi quantum well structure formed of an n-type or i-type $Al_xGa_{1-x}N$ barrier layer and a well layer of an n-type or i-type $Al_yGa_{1-y}N$ layer ($x > y$); an i-type $Al_xGa_{1-x}N$ final barrier layer; a p-type $Al_xGa_{1-x}N$ layer; and an electron blocking layer formed between the i-type $Al_xGa_{1-x}N$ final barrier layer and the p-type $Al_xGa_{1-x}N$ layer, the electron blocking layer being formed of a p-type or i-type $Al_zGa_{1-z}N$ layer ($x > y > z$, $0.95 < z \leq 1$) serving as an energy barrier for electrons from the i-type $Al_xGa_{1-x}N$ final barrier layer. The group III nitride single crystal may be a bulk crystal or an AlN-based group III nitride single crystal film formed on a sapphire substrate.

The thickness of the well layer of the $Al_yGa_{1-y}N$ layer is set to preferably 1.3 nm to 2.6 nm, more preferably 2.0 nm or less. Such thin well layer suppresses the piezoelectric field effect in the $Al_yGa_{1-y}N$ layer, and achieves such an emission characteristic that light is emitted from the direction perpendicular to the substrate surface.

The thickness of the i-type $Al_xGa_{1-x}N$ final barrier layer is set to preferably 2 nm to 12.6 nm, more preferably 10 nm or less. Such final barrier thickness can suppress asymmetry of an uppermost quantum well of the MQW (quantum well on the electron blocking layer side) at application of voltage (at the time of light emission) while keeping a blocking effect of the electron blocking layer, and thereby prevent split of a peak.

In some implementations, one half bandwidth of an XRC of a (10-12) plane of the AlN-based group III nitride single crystal is 400 arcsec or less, e.g., within the range of 200 to 300 arcsec. By reducing the edge dislocation density in this manner, it is possible to suppress the threading dislocation and improve emission characteristics.

In another aspect, this application provides a method of growing a light-emitting device structure formed on an AlN-based group III nitride single crystal including the steps of: growing a high-concentration n-type AlGaN layer; growing a multi quantum well structure formed of an i-type or n-type doped $Al_xGa_{1-x}N$ barrier layer and a well layer of an undoped $Al_yGa_{1-y}N$ layer ($x > y$); growing an i-type $Al_xGa_{1-x}N$; growing a p-type $Al_xGa_{1-x}N$ layer on the i-type $Al_xGa_{1-x}N$ layer; and growing an electron blocking layer between the i-type $Al_xGa_{1-x}N$ layer and the p-type $Al_xGa_{1-x}N$ layer formed on the i-type $Al_zGa_{1-z}N$ layer, the electron blocking layer being formed of a p-type or i-type $Al_zGa_{1-z}N$ layer ($x > y > z$, $0.95 < z \leq 1$) serving as an energy barrier for electrons in the n-type $Al_xGa_{1-x}N$ layer.

After the undoped AlN-based group III nitride regrowth layer is grown on the AlN-based group III nitride single crystal, the high-concentration n-type AlGaN layer may be grown. The growth temperature is preferably a low temperature in the range of 1000° C. to 1200° C. Such growth under low temperatures makes it possible to easily introduce a p-type impurity and to grow layers in a multilayered film under similar growth temperatures. Accordingly, the pGaN layer and the AlInGaN layer can be grown under lower temperatures than the above-mentioned temperatures.

Implementations of the devices and techniques described in this patent application can be used to greatly improve the light-emitting efficiency of the deep-UV light-emitting devices using group III nitride semiconductors.

EXPLANATION OF REFERENCE NUMERALS

1 . . . Deep UV LED,
3 . . . Sapphire substrate (0001),
5 . . . AlN layer,
7 . . . i-AlN regrowth layer,
11 . . . n-type Al0.76Ga0.24N layer,
15 . . . MQW (multi quantum well) layer formed of three layers of Al0.76Ga0.24N (barrier)-Al0.61Ga0.39N (well),
17 . . . AlN electron blocking layer,
21 . . . p-type (Mg-doped) Al0.76Ga0.24N layer,
25 . . . p-type (Mg-doped) GaN layer,
27, 31 . . . Ni—Au electrode.

DETAILED DESCRIPTION

The external quantum efficiency of a light-emitting device is represented as internal quantum efficiency×electron injection efficiency×light extraction efficiency. Based on the techniques described herein, by forming a light-emitting device structure on an AlN single crystal layer and optimizing the thickness of a quantum well of a MQW, the internal quantum efficiency is improved. In addition, the electron injection efficiency is improved by introducing and optimizing an electron blocking layer and optimizing a final barrier layer. A deep-UV light-emitting device using a group III nitride will be described below with reference to the drawings.

Figure 1:
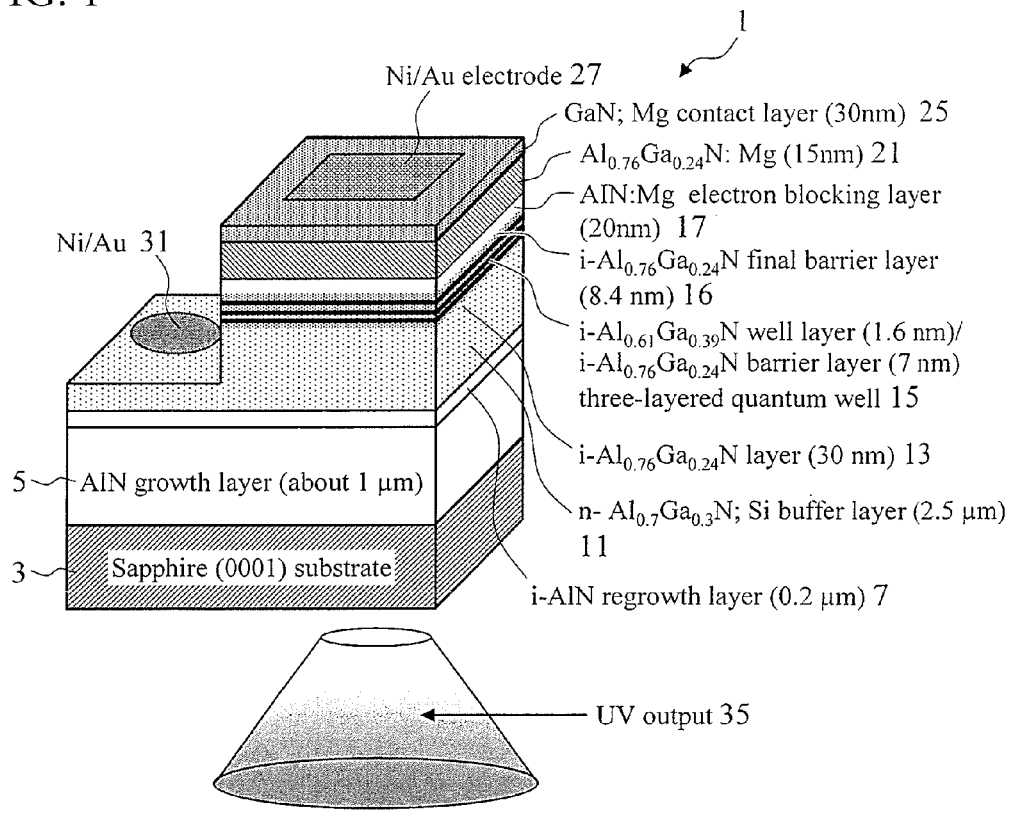
FIG. 1 is a perspective view showing an example of a structure of an AlGaN quantum well deep UV LED (hereinafter, referred to as a "deep UV LED") as an example of a deep-UV light-emitting device using a group III nitride.
Figure 2:
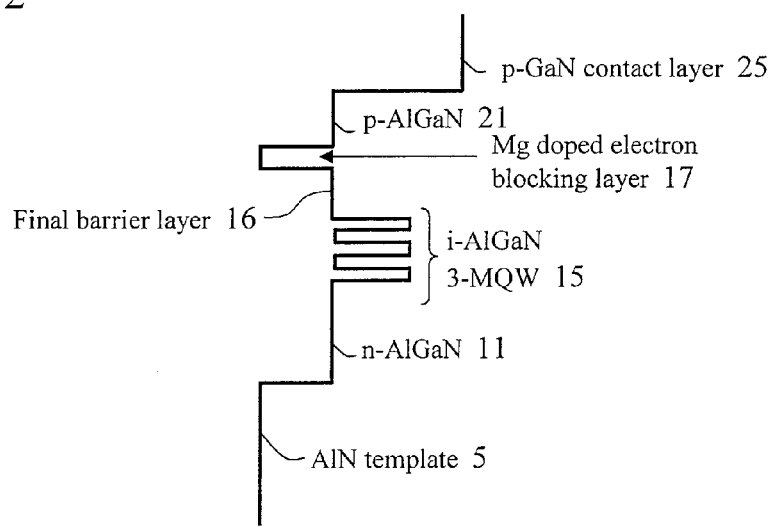
FIG. 2 is an energy band diagram of the conduction band edge of the structure shown in FIG. 1.

FIG. 1 is a perspective view showing an example of a structure of an AlGaN quantum well deep UV LED (hereinafter, referred to as a "deep UV LED") as an example of the deep-UV light-emitting device using the group III nitride according to this embodiment. FIG. 2 is an energy band diagram of a conduction band of the structure shown in FIG. 1. As shown in FIGS. 1 and 2, the deep UV LED 1 in this embodiment is formed on an AlN template (manufactured by Dowa Semiconductor CO., LTD.,) including a sapphire substrate 3 and an AlN layer 5 formed thereon.

TABLE 1

| Emission wavelength | AlGaN well layer | AlGaN barrier layer | Maximum CW output |
|---|---|---|---|
| 234 nm (CW) | 0.74 | 0.84 | 0.4 mW |
| 241 nm (CW) | 0.68 | 0.8 | 1.1 mW |
| 254 nm (CW) | 0.61 | 0.76 | 4 mW |
| 264 nm (CW) | 0.53 | 0.7 | 11.6 mW |

Table 1 is a drawing showing the emission wavelengths, MQW parameters of and a maximum CW output obtained by the present inventors in the deep-UV light-emitting device at filing of this application. Description will be made with reference to this Table, as appropriate.

AlN-Based Group III Nitride Single Crystal

Although this specification describes the case of forming the light-emitting device structure on an AlN-based group III nitride single crystal, the AlN-based group III nitride single crystal may be a bulk AlN-based group III nitride single crystal. Alternatively, an AlN-based group III nitride single crystal film formed on a single crystal substrate such as a sapphire substrate, called a template, may be used. Here, the case of forming the deep-UV light-emitting device structure on an AlN template is shown as an example. As a substrate for the AlN template, a C-plane sapphire substrate is preferably used because of easiness of growth of a flat surface, but is not limited thereto.

An AlN template containing a slight amount of group III element such as Ga may be adopted as the AlN template. Specifically, whether or not it is intended, the AlN layer in the AlN template can contain about 1% of impurities, for example. In other words, if an AlN-based group III nitride is employed as the AlN, the AlN-based group III nitride should be one including 90% or more of AL in the group III elements. More preferably, the AlN template may be an AlN layer.

For example, an AlN/sapphire template (hereinafter, referred to as an AlN template) manufactured by Dowa Semiconductor CO., LTD. is used as the AlN template. In this AlN template, a large number of edge dislocation density, which has been a problem, can be reduced from a conventional value of $5\times10^9$ cm$^{-2}$ to about the first half of the order of $10^8$ cm$^{-2}$ to the order of $10^7$ cm$^{-2}$. The full width at half maximum of an X-Ray Rocking Curve (XRC), a kind of crystal quality evaluation technique using the X ray, which is an index for crystal quality, of a (10-12) plane is 100 to 400 arcsec (preferably, 300 arcsec or less) and such crystal quality is desirable in order to improve the internal quantum efficiency of the light-emitting device. Here, the full width at half maximum value is greatly reduced by about half as compared to that of an AlN template using the NH$_3$ pulse flow multistage growth method which is a conventional optimum method and is developed and optimized by the applicants. An AlN layer formed by the high-temperature growth method or the NH$_3$ pulse flow method proposed by the applicants may be used in place of the AlN/sapphire template.

Furthermore, the surface roughness of the AlN template is a favorable value of (RMS) <0.3 nm. For this reason, the thickness of an AlN growth layer 5 on the template can be reduced to only about 1 μm which is about one third of the conventional thickness. It can be said that, since the favorable AlN template can be obtained, optimization of each of the below mentioned element techniques can first be achieved. Note that even in the case of RMS <0.4 nm, excellent characteristics may be obtained.

Structure of Light-Emitting Device

Subsequently, according to the MOCVD, an i-AlN regrowth layer 7 having a thickness of 0.2 μm; an n-type n-Al$_{0.7}$Ga$_{0.3}$N buffer layer 11 having a thickness of 2.5 (high-concentration n-type group III nitride layer, here, the "high-concentration" means about $1\times10^{18}$ cm$^{-3}$ or more, but is not limited to thereto); an i-type (or n-type) Al$_{0.76}$Ga$_{0.24}$N layer 13 having a thickness of 30 nm; a MQW (multi quantum well) layer 15 formed of three layers of Al$_{0.76}$Ga$_{0.24}$N (barrier layer: 7 nm in thickness) and three layers of Al$_{0.61}$Ga$_{0.39}$N (well layer: 1.6 nm in thickness); an i-Al$_{0.76}$Ga$_{0.24}$N final barrier layer 16 having a thickness of 8.4 nm; a Mg-doped AlN electron blocking layer 17 having a thickness of 20 nm; a p-type (Mg-doped) Al$_{0.76}$Ga$_{0.24}$N layer 21 having a thickness of 15 nm; and a p-type (Mg-doped) GaN layer 25 having a thickness of 30 nm are stacked in this order. An Ni—Au electrode 31 is formed in the n-type (Si-doped) Al$_{0.76}$Ga$_{0.24}$N layer 11 and an Ni—Au electrode 27 is formed in the p-type (Mg-doped) GaN layer 25. When an appropriate voltage is applied between the electrodes 27 and 31, UV light is emitted The AlN electron blocking layer 17 is p-type doped, but may be i-type doped. This structure is a 254 nm AlGaN quantum well LED. The term "i-type doped" means a case where the carrier density is low and no intentional doping is performed. For example, the term "i-type doped" means a case where the carrier density is $1\times10^{15}$ cm$^{-3}$ or less. However, even in a case where impurities (for example, C contained in organic metals, atmosphere impurity O and in-furnace member impurity Si originated from in-furnace parts) are unintentionally contained, if the carrier density is low, the layer is represented as i-type.

Here, the group III nitride is used as a material for the light-emitting layer formed of the MQW, and the AlGaN layer is used as a specific example. However, for example, about 1% of a group III element such as In or B (boron) may be added as an impurity. Generally, AlGaN (Al$_x$Ga$_{1-x}$N) is used in a UV light-emitting device. When In is added to AlGaN, the light-emitting efficiency is greatly improved, and sometimes can emit light at high efficiency even with more threading dislocation. In this case, InAlGaN(In$_x$Al$_y$Ga$_{1-x-y}$N) is used.

For example, when B is added to AlGaN, there is a possibility that the emission wavelength can be shifted to the short wavelength side. For example, light emission of 190 nm to 210 nm is expected. In other words, BAlInGaN can be used as a material for the light-emitting layer and the composition thereof is expressed as B$_x$Al$_y$In$_z$Ga$_{1-x-y-z}$N.

As long as similar effects can be obtained, another layer may be introduced between the-above-mentioned layers in the device structure.

(Use of High Al Composition AlGaN Electron Blocking Layer)

TABLE 2

Electron blocking layer growth conditions
Growth temperature: 1100° C.
Growth pressure: 76 Torr

| | |
|---|---|
| TMGA | 0, 0.5, 2 sccm |
| TMA | 50 sccm |
| Growth time | 60 sec |

Table 2 shows an example of growth conditions of the electron blocking layer 17, in which the growth temperature (substrate temperature) is 1100° C. and the growth pressure is 76 Torr. The conventional crystal growth temperature of AlN is about 1300° C. In contrast, the crystal growth temperature in this embodiment is reduced to 1100° C. for increasing the Mg impurity concentration and for other purposes. Here, the thickness of the electron blocking layer 17 is fixed to 20 nm, and in the device with the structure shown in FIG. 1, the Al composition of the electron blocking layer 17 is changed. The influence of this change in Al composition is examined. Since Ga is not introduced into the AlN electron blocking layer 17, an amount supplied of TMGa is 0 sccm. When the amounts of supplied TMGa are 0.5 sccm and 2 sccm, Al compositions are 0.97 and 0.89, respectively (refer to FIG. 4). In the case of the 254 nm light-emitting LED, band discontinuity values of the conduction band for the Al compositions of 1.0, 0.97 and 0.89 are about 670 meV, 520 meV, and 300 meV, respectively.

Figure 4:
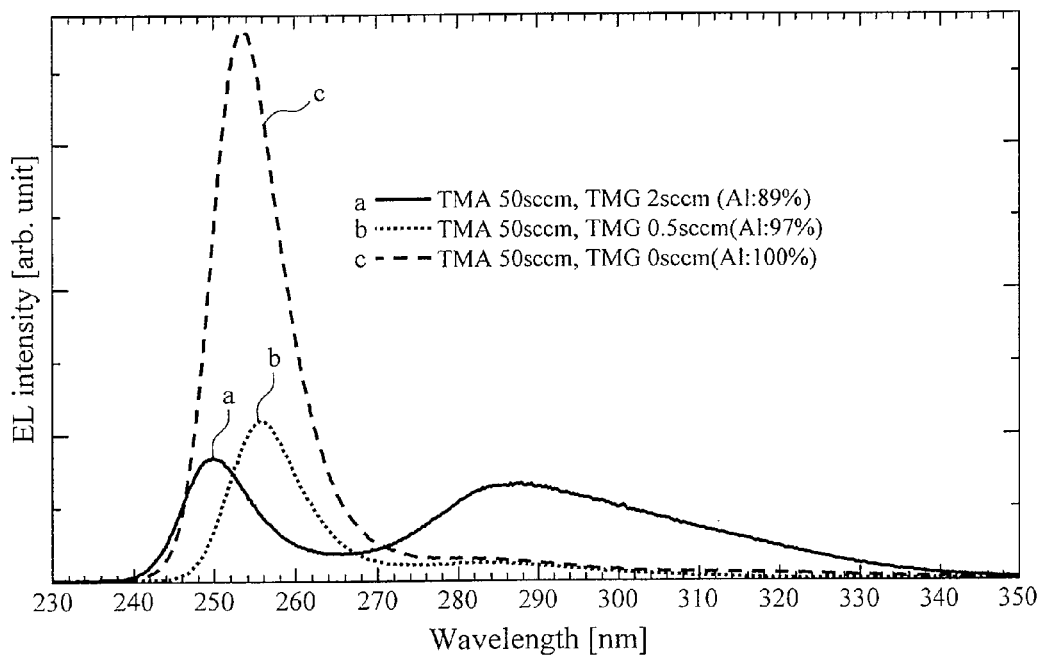
FIG. 4 is a graph showing an electron blocking layer barrier height dependence of the EL intensity in the AlGaN quantum well LED.

FIG. 4 is a graph showing an electron blocking layer barrier height dependence of the EL intensity. The thickness of the AN at this time is 20 nm. FIG. 4 shows the dependence on the x value in Al$_x$Ga$_{1-x}$N. As an x value is larger (a to c), the EL intensity in the 260 nm band becomes larger. Meanwhile, in the case where the molar ratio of Al is 0.89 (reference numeral a in this figure), a broad emission peak, that is, the emission peak by the p-AlGaN layer 21 is observed around 290 nm, which indicates that electrons overflow from the MQW. In the case where the molar ratios of Al are 0.97 and 1.0, the EL intensity in the wavelength band is not substantially observed in this wavelength band, which indicates that electron overflow is satisfactorily controlled by using the high electron blocking layer. In the case where the molar ratio of Al is 0.95 or more, similar results are obtained.

The Mg activation ratio in the p-AlGaN layer 21 is low. Accordingly, even when the p-AlGaN layer 21 is actually doped with about $10^{19}$ cm$^{-3}$ of Mg impurity, the hole concentration substantially becomes about $10^{13}$ cm$^{-3}$. Since the hole concentration of the p-type layer used for the PN junction in the normal LED or LD is about $2\times10^{18}$ to $5\times10^{18}$ cm$^{-3}$, the above-mentioned value is a very low. When the hole concentration is low, most electrons diffuse in the p layer and the proportion of electrons injected into the well becomes extremely small. For this reason, the electron injection efficiency lowers. When the electron blocking layer is not provided, the electron injection efficiency is at most a few percent. By using the relatively thick electron blocking layer 17 and suppressing electron overflow from the MQW layer 15, the electron injection efficiency can be greatly improved. For example, the thickness of the electron blocking layer is set to be 6 nm or more. Thereby, electron overflow can be effectively suppressed, improving the injection efficiency. An upper limit of the thickness is not particularly limited, but when the thickness is increased, the operational voltage becomes high due to an increase in resistance. Accordingly, the thickness is preferably set to be 30 nm or less.

Figure 3:
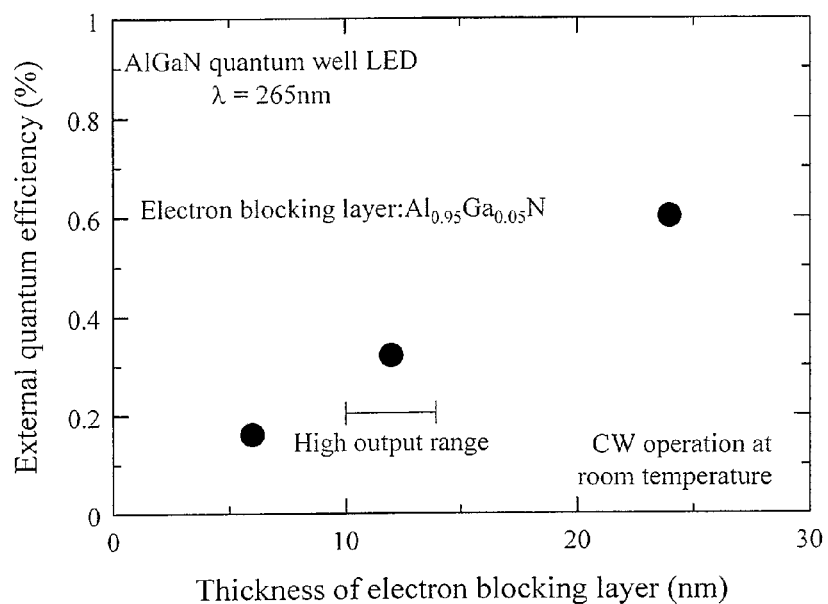
FIG. 3 is a graph showing an electron blocking layer thickness dependence of an external quantum efficiency in an AlGaN quantum well LED.

FIG. 3 is a graph showing an electron blocking layer thickness dependence of the external quantum efficiency. As shown in FIG. 3, as the thickness of the electron blocking layer is larger, the external quantum efficiency (in turn, electron injection efficiency) of the CW operation at room temperature is increased due to the effect of suppressing electron overflow. However, since the internal quantum efficiency is determined depending on the design of the quantum well, the internal quantum efficiency does not change. In fact, when the electron blocking layer is too thick, the output is lowered. In the examples shown in FIG. 3, the high output can be achieved in the range of 6 nm to 26 nm, and more preferable high output can be achieved in the range of 10 nm to 20 nm. In other words, the thickness of the electron blocking layer falls within the range of, preferably 6 nm to 26 nm, more preferably, 10 nm to 20 nm.

By providing the Al(Ga)N electron blocking layer having a high Al molar ratio, for example, of 0.95 or more in this manner, the external quantum efficiency can be improved, and the emission intensity itself can be increased, thereby making it possible to obtain a highly practical excellent value.

(Use of Thin Quantum Well in MQW)

Next, use of a thin quantum well will be described. Here, the growth time of the quantum well layer 15 is varied, thereby varying the thickness.

TABLE 3

AlGaN-MQW growth conditions
Growth temperature: 1120° C.
Growth pressure: 76 Torr
Template growth conditions are fixed.

|  | Well | Barrier |
|---|---|---|
| TMG | 4 sccm | 2 sccm |
| TMA | 40 sccm | 50 sccm |
| Growth time | 3 to 7 seconds | 15 sec |

Table 3 shows growth conditions of AlGaN-MQW. The growth temperature is 1120° C. which is close to 1100° C. as the growth temperature of the AlN electron blocking layer, and the growth pressure is 76 Torr. In other words, in this embodiment, the growth temperature can be kept substantially constant, enabling stable growth.

TABLE 4

| Growth time | | Quantum well width |
|---|---|---|
| 3 seconds | → | 1.6 nm |
| 5 seconds | → | 2.5 nm |
| 7 seconds | → | 4.0 nm |

Table 4 shows relationship between the growth time shown in Table 2 and the thickness of the quantum well of the MQW. As shown in Table 3, when the growth time is 3 s, the quantum well width is 1.6 nm, when the growth time is 5 s, the quantum well width is 2.5 nm, and when the growth time is 7 s, the quantum well width is 4.0 nm. Observation of the cross section TEM shows that favorable MQWs are formed. Accordingly, the quantum well width can be controlled depending on the growth time with high accuracy of the order of the atomic layer.

Figure 6:
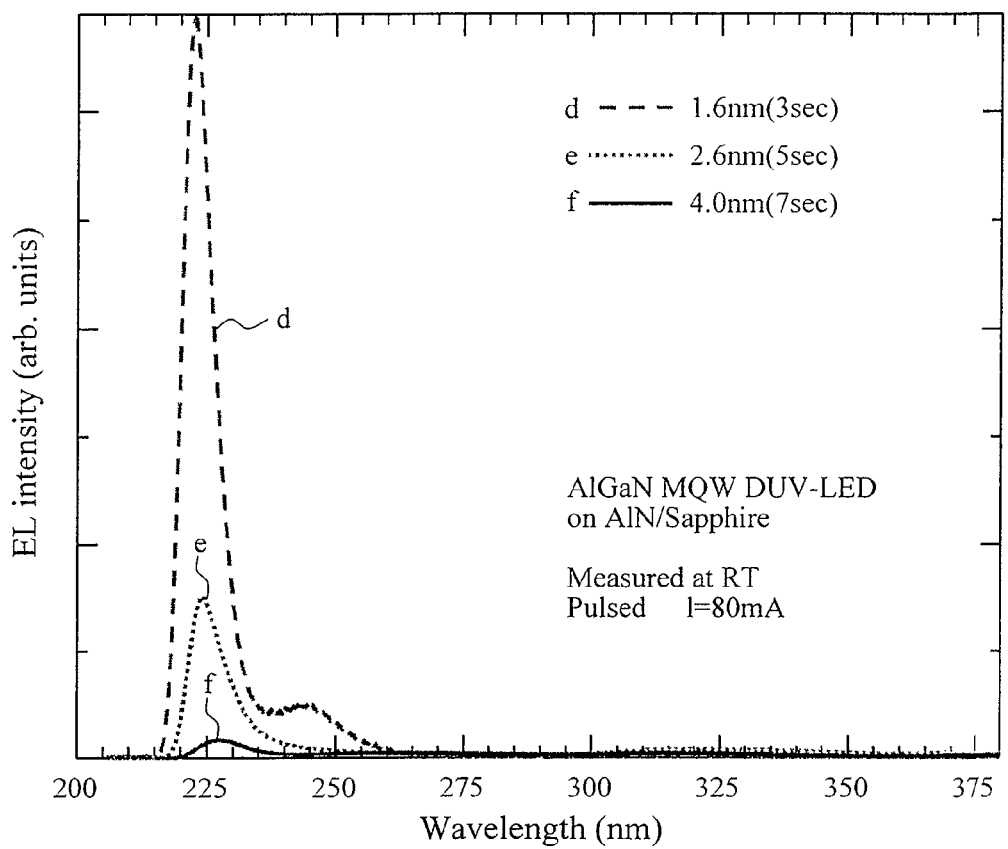
FIG. 6 is a graph showing a quantum well width dependence of EL intensity in AlGaN-MQW.

FIG. 6 is a graph showing a quantum well width dependence of EL intensity in AlGaN-MQW in the case where the thickness of the well layer of the three-layered quantum well 15 is varied in the device with the structure shown in FIG. 1. As shown in Table 3, the quantum well widths of the MQWs are controlled by the growth time to 1.6 nm, 2.6 nm and 4.0 nm as shown in Table 3. In these cases, the EL intensity is increased by 40 times by decreasing the quantum well width from 4.0 nm to 1.6 nm. As the well width is thinner, the emission wavelength is shifted to the short wavelength side by about 4.8 nm due to a change in quantum confinement energy of electron and hole. This also suggests that the emission intensity can be increased by making the quantum well width thinner.

By decreasing the quantum well width to about 1.6 nm as described above, the emission intensity can be greatly improved. The quantum well width for a deep-UV light-emitting device is preferably 2.6 nm or less (more preferably 2.0 nm or less). In terms of the piezoelectric field reduction effect and the below-mentioned emission to the plane perpendicular to the substrate, it is desired that the quantum well width be 2 nm or less and as thin as possible. However, if the quantum well is too thin, the electron wave function becomes broad and thereby the light-emitting efficiency lowers. Thus, an optimum value exists. Actually, it is considered that the thickness in the range of 1.3 nm to 2 nm is optimum.

Figure 7:
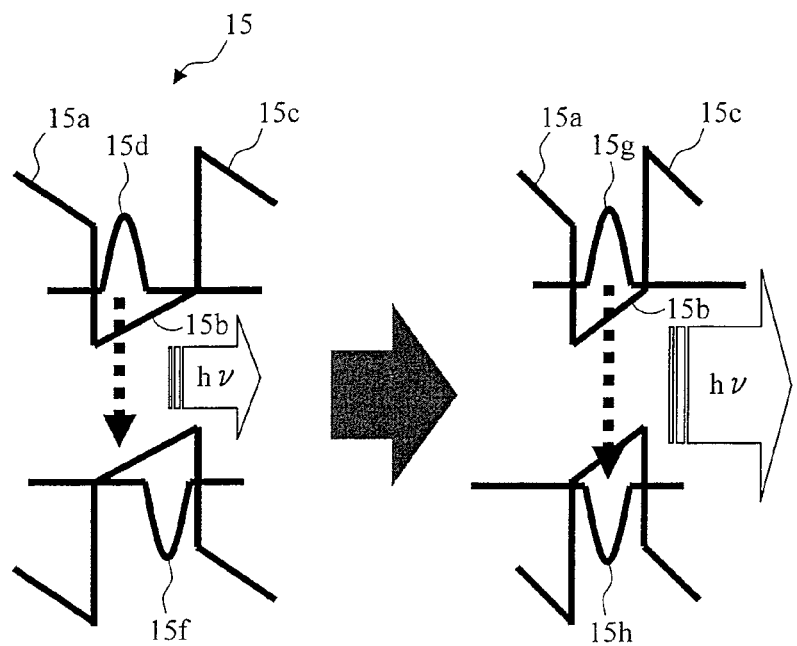
FIG. 7 is an energy band diagram of a conduction band to an MQW quantum well and a valence band, for describing inventors' consideration concerning the principle on which the output is increased by making the quantum well width thinner.

FIG. 7 is an energy band diagram of a conduction band to the MQW quantum well and a valence band, for describing inventors' consideration concerning the principle on which the output is increased by making the quantum well width thinner. As shown on the right side of FIG. 7, the quantum well structure 15 includes a first barrier layer 15a on the substrate side, a quantum well layer 15b and a second quantum well layer 15c on the opposite side to the substrate. It is considered that, when the quantum well is thinner (on the right side of FIG. 7) than that in the case where the quantum well is thick (on the left side of FIG. 7), the piezoelectric field effect becomes less influential, and thereby the output of the quantum well is improved.

Figure 5A:
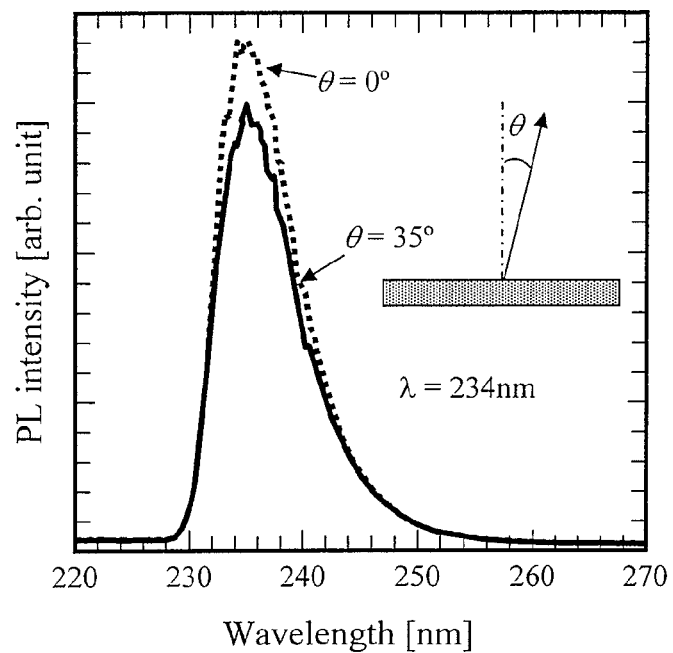
FIG. 5A is a graph showing a measured angle dependence of a wavelength dependence of the emission spectrum of the AlGaN quantum well LED at 234 nm.
Figure 5B:
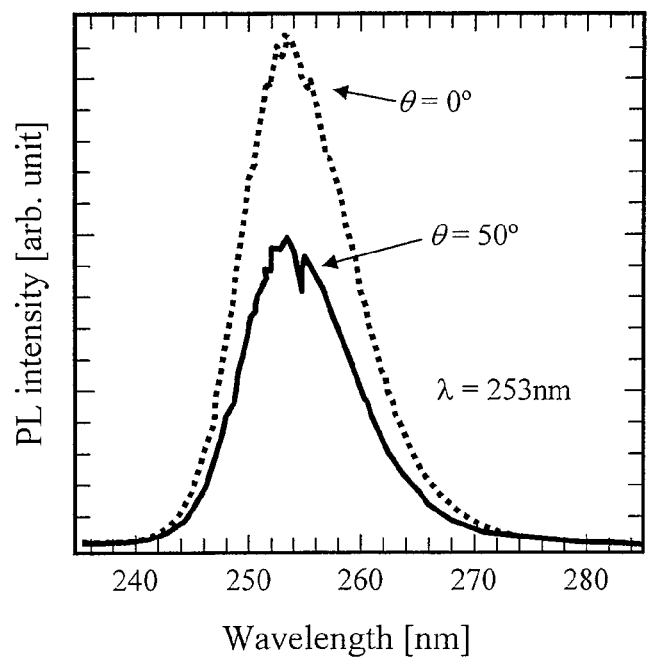
FIG. 5B is a graph showing a measured angle dependence of a wavelength dependence of the emission spectrum of the AlGaN quantum well LED at 253 nm.

Since the $Al_{0.61}Ga_{0.39}N$ (well) layer in the MQW layer 15 has a relatively high Al composition, as distinct from the GaN well, the main light of the $Al_{0.61}Ga_{0.39}N$ (well) layer is polarized to E//c (substrate surface). FIG. 5A is a graph showing a measured angle dependence of the emission spectrum at 234 nm. FIG. 5B is a view showing a measured angle dependence of the emission spectrum at 253 nm. Both of the figures indicate that as an angle is increased from the c-axis direction, the PL emission intensity lowers. It is shown that when a thinner AlGaN quantum well is used as described above, emission perpendicular to the substrate surface can be achieved.

This may be caused by band crossing in which characteristics in valence band edges are introduced due to quantum confinement and strain when the thickness of the quantum well is decreased (on the right side in FIG. 7). Thereby, emission perpendicular to the substrate surface can be achieved. In this phenomenon, the location of an electron distribution 15d and the location of a hole distribution 15f do not match in terms of the barrier thickness direction. On the other hand, when the thin well layer of 2 nm or less is used, the location of an electron distribution 15g and the location of a hole distribution 15h match in terms of the barrier thickness direction. Accordingly, the output in the quantum well is advantageously increased. A more preferable well width falls within the range of 1.3 nm to 2.0 nm.

As described above, by setting the thickness of the quantum well to an appropriate value, the emission output can be improved.

(Final Barrier Layer between MQW and Electron Blocking Layer)

The final barrier layer 16 disposed between the MQW and the electron blocking layer is an undoped AlGaN layer. The thickness thereof will be described.

TABLE 5

Cap layer growth conditions
Growth temperature: 1120° C.
Growth pressure: 76 Torr
Growth time

| | |
|---|---|
| TMG | 4 sccm |
| TMA | 50 sccm |
| Growth time | 30 seconds (8.4 nm) |
| | 45 seconds (12.6 nm) |
| | 75 seconds (20 nm) |

Table 5 shows growth condition of the undoped AlGaN layer. Here, in the device with the structure shown in FIG. 1, the growth time of the final barrier layer 16 (iAlGaN) is changed, and its thickness is changed. The growth temperature is 1120° C., and the pressure is 76 Torr, which are the same growth conditions as in the MQW layer. Here, feeding gas is TMG and TMA and the growth time is varied to 30 s, 45 s and 75 s. The thicknesses of the final barrier layer in these cases are 8.4 nm, 12.6 nm and 20 nm, respectively.

Figure 8:
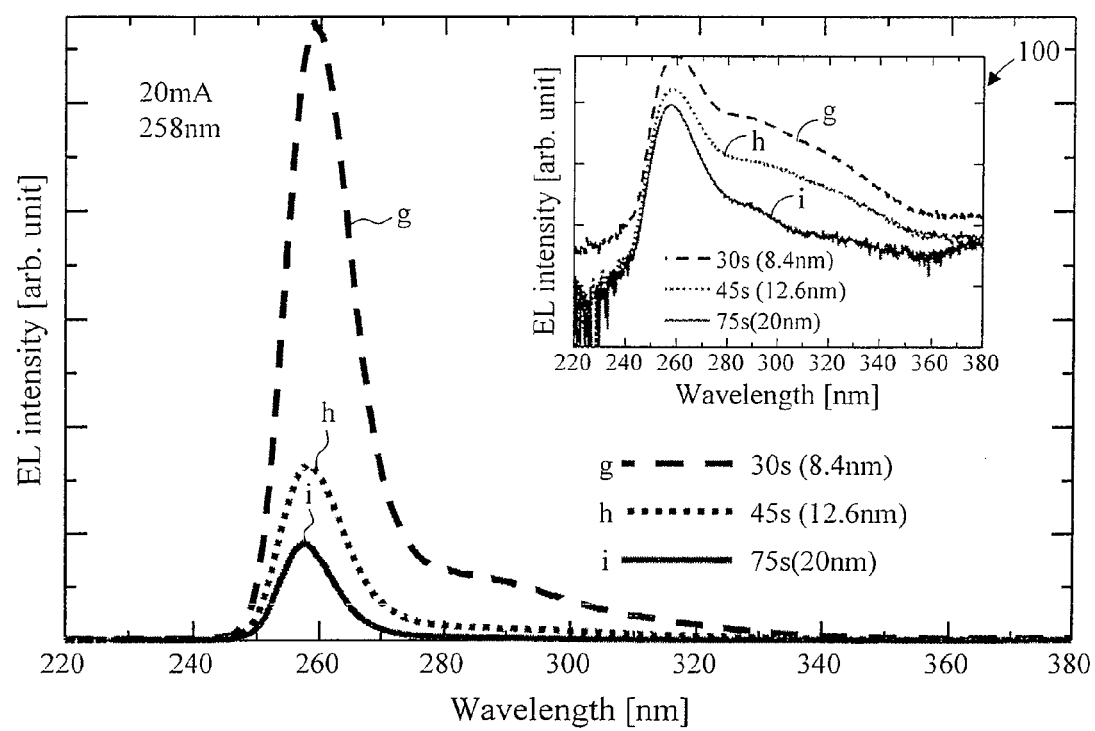
FIG. 8 is a graph showing wavelength dependences of the EL intensity (20 mA, and a peak wavelength of 258 nm) in the cases where the thicknesses of final barrier layers are 8.4 nm (g), 12.6 nm (h) and 20 nm (i), respectively.
Figure 9A:
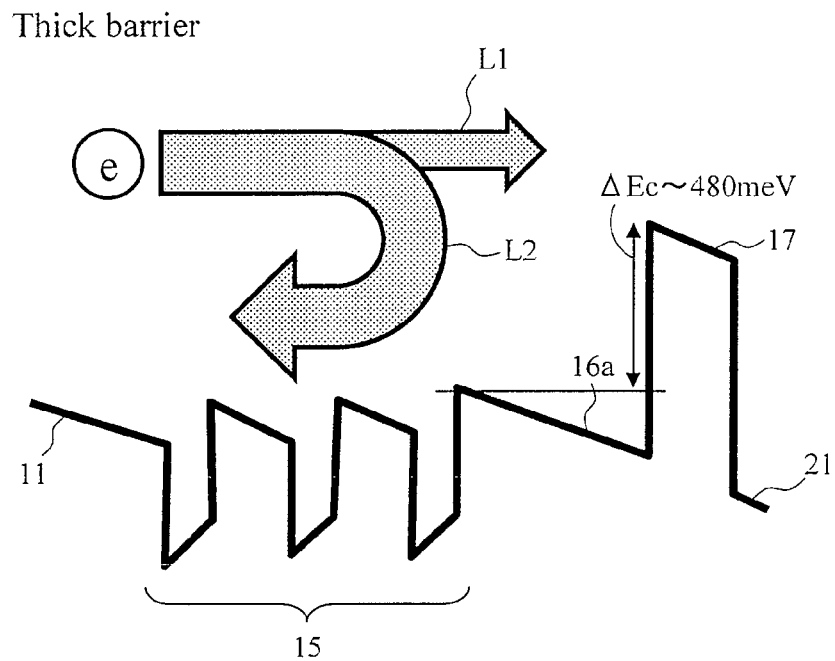
FIGS. 9A and 9B are diagrams schematically showing how electron flow changes in accordance with a change in the thickness of a quantum well barrier (final barrier) layer on the MQW.
Figure 9B:
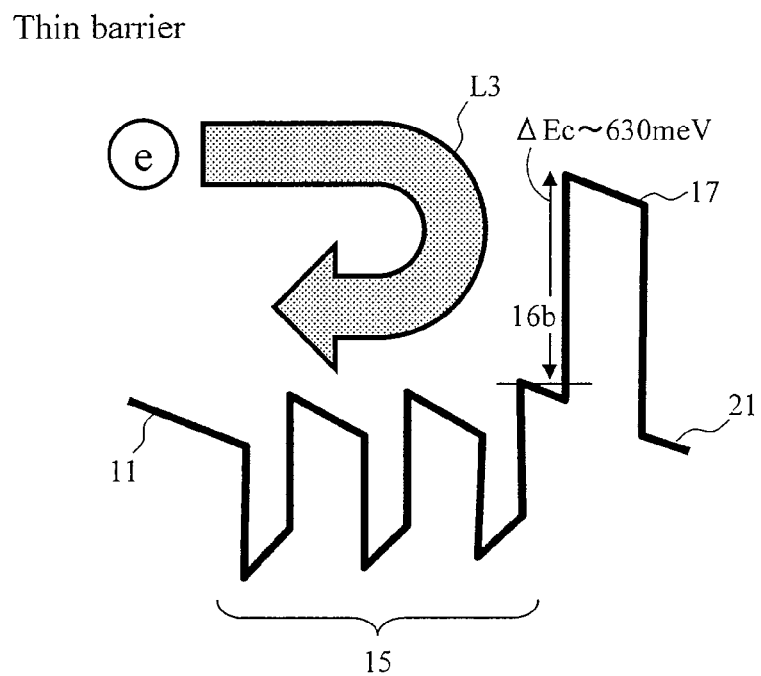

FIG. 8 is a graph showing a wavelength dependence of the EL intensity (20 mA, a peak wavelength of 258 nm) in the thicknesses of the final barrier layer of 8.4 nm (g), 12.6 nm (h) and 20 nm (i). As shown in FIG. 8, as the thickness of the final barrier layer is thinner, the EL emission intensity becomes higher. An inset denoted by a reference numeral 100 shows the same result using a log axis as a vertical axis. By making the thickness of the final barrier layer thinner from 20 nm to 8.4 nm, the EL emission intensity is greatly increased by six times. FIGS. 9A and 9B are diagrams schematically showing how electron flow changes in accordance with a change in the thickness of the quantum well barrier layer (barrier layer on the electron blocking layer side: final barrier layer) on the MQW.

FIG. 9A is a diagram showing the case where the thickness of the final barrier layer is, for example, 10 nm or more, and shows the MQW 15 including the final barrier 16a, the electron blocking layer 17 and the p-AlGaN layer 21. Suppose a case where the thickness of the final barrier 16a is made to be equal to the thickness of the barrier layer of the MQW (here, 7 nm) or more (for example, 10 nm). In such a case, when a positive voltage is applied to the electrode on the p side and the emitting state is achieved, light emission quantum level energy of the uppermost quantum well on the final barrier side of the MQW becomes equal to those of the other quantum wells because of the thick final barrier 16a, and the emission peak tends to be a single peak. On the other hand, suppose a case where the thickness of the final barrier 16a is more than 10 nm. In such a case, when a positive voltage is applied to the electrode on the p side, en effective barrier height against electrons in the electron blocking layer 17, with respect to the MQW quantum level, lowers to about 480 meV due to voltage drop by the final barrier. This causes a problem that leak of electrons from the MQW side to the p layer 21 side becomes large.

In contrast, as shown in FIG. 9B, suppose a case where the thickness of the final barrier 16b is made to be smaller than one fifth of the thickness of the barrier layer of the MQW (here, 7 nm), for example, smaller than 2 nm.

In such a case, when a positive voltage is applied to the electrode on the p side, the uppermost quantum well on the final barrier side in the MQW tends to be asymmetric because of the thin final barrier 16a. For this reason, disadvantageously, the light emission quantization level easily deviates from the quantization levels of the other quantum wells and thereby the peak is not single (easy to split). On the other hand, by making the final barrier 16b thinner, as an effective barrier height of the electron blocking layer 17 with respect to the quantum level of the MQW, a high value such as about 630 meV can be kept. Thereby, leak of electrons from the MQW side to the p layer 21 side can be suppressed. However, when the final barrier is too thin, the symmetric property of the uppermost quantum well on the final barrier side in the MQW lowers, generating split of the peak. Thus, the thickness of the final barrier 16b is preferably 2 nm to 10 nm in order to keep the height of the electron blocking layer and to avoid the asymmetrization of the uppermost quantum well in the MQW at application of the voltage.

As described above, a high quality AlN template is employed, and the height and thickness of the electron blocking layer is optimized to such an extent that leak of electrons is prevented and lowering of the output is avoided. Moreover, the emission perpendicular to the substrate surface is enabled by use of the thin quantum well in the MQW, and the thickness of the final barrier is set to such a value that the height of the electron blocking layer can be kept and the asymmetrization of the MQW can be avoided. As a result, excellent luminous characteristics can be obtained. Each Example will be described below.

Detailed characteristics of deep-UV light-emitting devices (LEDs) having emission wavelengths shown in Table 1 will be described below.

FIRST EXAMPLE

Next, a First Example of an UV LED device will be described. A template obtained by forming a C plane AlN single crystal film having a thickness of 0.8 μm on a C plane sapphire substrate was used as a group III single crystal. The full width at half maximum value of an X ray locking curve the (10-12) plane of the AlN single crystal film is 250 seconds. A device having the structure shown in FIG. 1 except for the below-mentioned thickness and composition was formed on the template according to the MOCVD method. AlN having a thickness of 6 nm as the electron blocking layer, AlGaN (its composition is described in Table 1) having a thickness of 8.4 nm as the final barrier layer and AlGaN (its composition is described in Table 1) having a thickness of 1.6 nm as the light-emitting layer are formed. Considering optimization of each of the above-mentioned components, characteristics of the AlGaN-LED which emits light in the 264 nm band are shown. As shown in Table 1, the molar ratios of Al in the i-AlGaN well layer and the barrier layer are 0.53 and 0.7, respectively.

Figure 10:
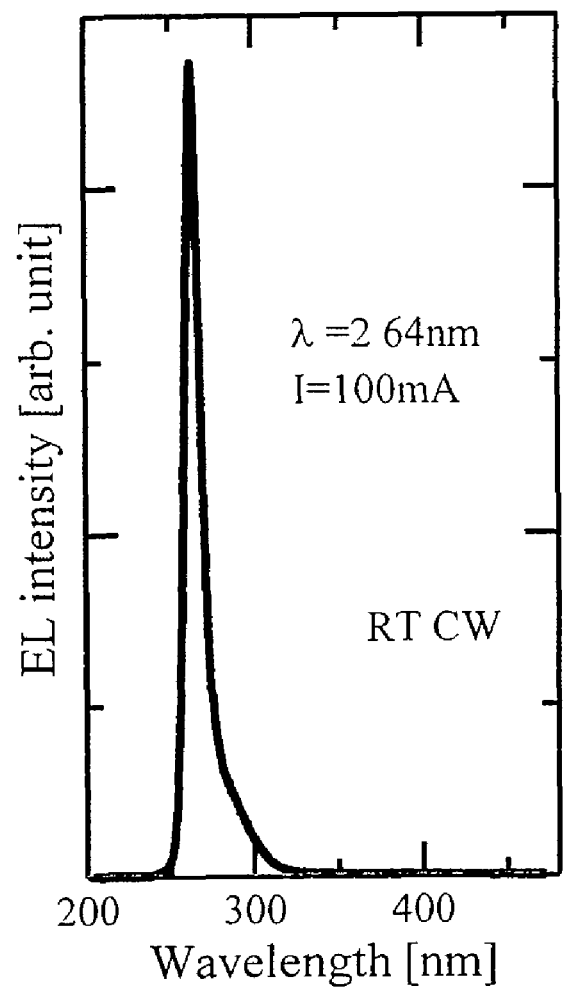
FIG. 10 is a graph showing a wavelength dependence of the EL emission intensity in an exemplary UV light-emitting device.
Figure 11:
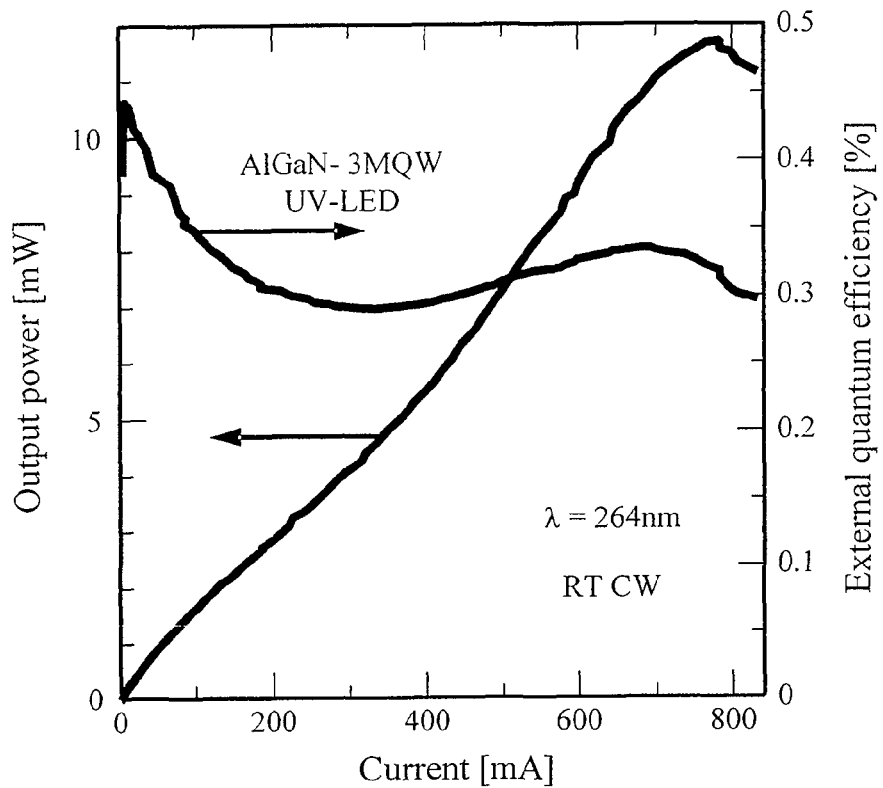
FIG. 11 is a graph showing a current value dependence of an output voltage and an external quantum efficiency in the UV light-emitting device shown in FIG. 10.

FIG. 10 is a graph showing a wavelength dependence of the EL emission intensity. As shown in FIG. 10, at a current of 100 mA, a single peak is observed in the 264 nm wavelength band at room temperature. FIG. 11 is a graph showing a current value dependence of an output voltage and an external quantum efficiency. As shown in FIG. 11, the maximum output of 11.6 mW and the maximum external quantum efficiency of 0.44% are obtained. As described above, it is found out that according to the method of this embodiment, it is possible to obtain a 264 nm band LED capable of providing an output of 11.6 mW, that is, an output of 10 mW (770 mA) or more.

SECOND EXAMPLE

Next, Second Example of a UV LED device will be described. Considering optimization of each of the above-mentioned components, an AlGaN-LED which emits light in of the 254 nm band will be described. A light-emitting device having the same structure as that in First Example except that as shown in Table 1, the molar ratios of Al in the i-AlGaN well layer and the barrier layer are 0.61 and 0.8, respectively, was formed. In this case, a favorable value of 4 mW is obtained as the CW output.

THIRD EXAMPLE

Next, Third Example of an UV LED device will be described. Considering optimization of each of the above-mentioned components, characteristics of an AlGaN-LED which emits light in the 241 nm band are shown. A light-emitting device having the same structure as that in First Example except that as shown in Table 1, the molar ratios of Al in the i-AlGaN well layer and the barrier layer are 0.68 and 0.8, respectively, was formed.

Figure 12:
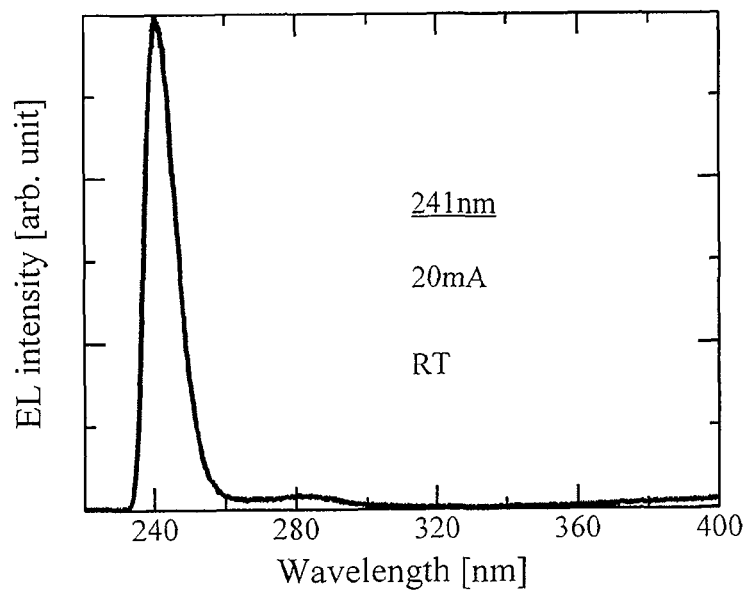
FIG. 12 is a graph showing a wavelength dependence of the EL emission intensity in an exemplary UV light-emitting device.
Figure 13:
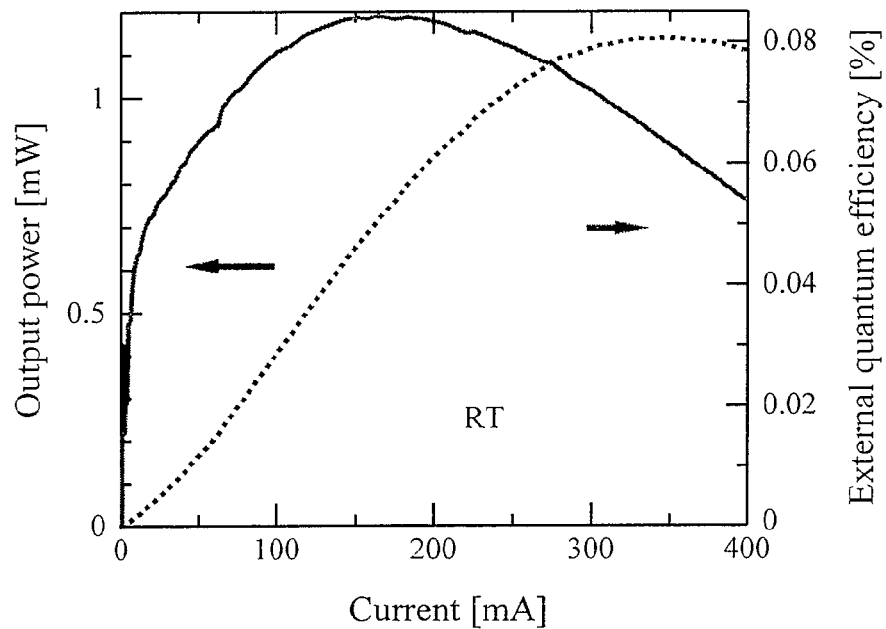
FIG. 13 is a graph showing a current value dependence of the output voltage and the external quantum efficiency in the UV light-emitting device shown in FIG. 12.

FIG. 12 is a graph showing a wavelength dependence of the EL emission intensity. As shown in FIG. 12, at a current of 20 mA, a single peak is observed in the 241 nm wavelength band at room temperature. FIG. 13 is a graph showing a current value dependence of the output voltage and the external quantum efficiency. As shown in FIG. 13, the maximum output of 1.13 mW and the maximum external quantum efficiency of 0.084% are obtained. As described above, it is found out that, according to the method in this Embodiment, it is possible to obtain a 241 nm band LED capable of providing a milliwatt-order output.

FOURTH EXAMPLE

Next, Fourth Example of an UV LED device will be described. Considering optimization of each of the above-mentioned components, characteristics of an AlGaN-LED which emits light in the 234 nm band are shown. A light-emitting device having the same structure as that in First Example except that as shown in Table 1, the molar ratios of Al in the i-AlGaN well layer and the barrier layer are 0.74 and 0.84, respectively, was formed.

Figure 14:
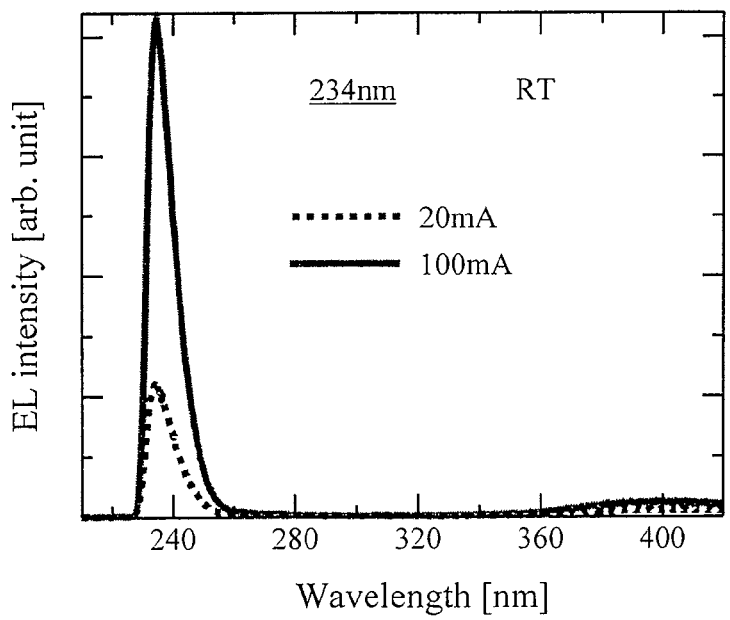
FIG. 14 is a graph showing a wavelength dependence of the EL emission intensity in an exemplary UV light-emitting device.
Figure 15:
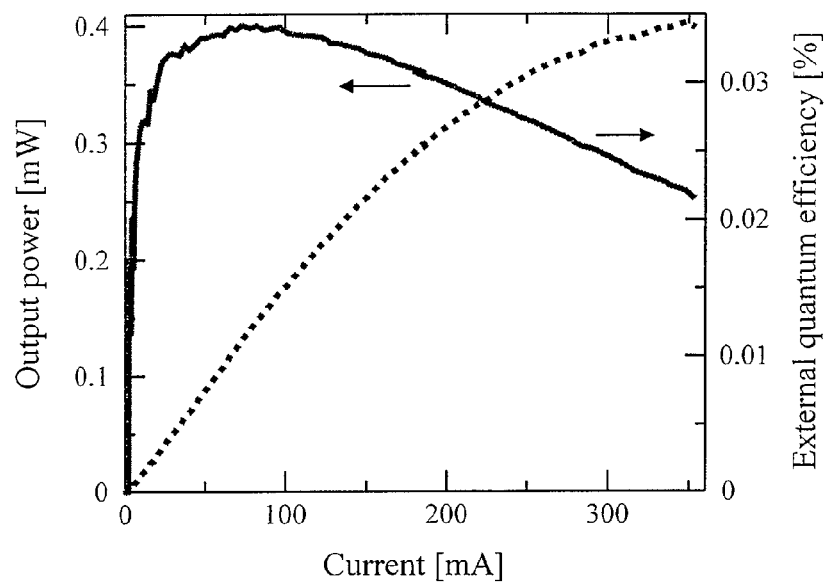
FIG. 15 is a graph showing the current value dependence of the output voltage and the external quantum efficiency in the UV light-emitting device shown in FIG. 14.

As shown in FIG. 14, at currents of 20 mA and 100 mA, single peaks are observed in the 234 nm wavelength band at room temperature. FIG. 15 is a graph showing a current value dependence of the output voltage and the external quantum efficiency. As shown in FIG. 15, the maximum output of 0.4 mW and the maximum external quantum efficiency of 0.034% are obtained. As described above, it is found out that according to the method in this embodiment, it is possible to obtain a 234 nm band LED capable of providing a sub-mW, which is well over the conventional values.

(Conclusion)

Figure 16:
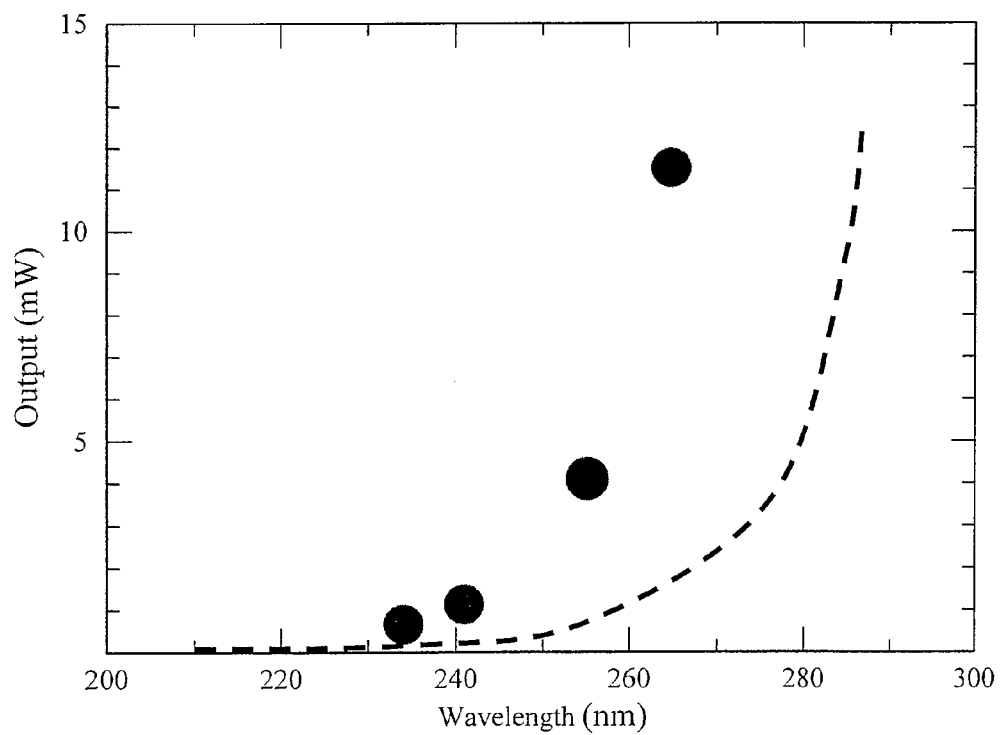
FIG. 16 is a graph showing a wavelength dependence of an output of an UV LED (single chip-type).

FIG. 16 is a graph showing a wavelength dependence of an output of an UV LED (single chip-type). A broken line represents conventional characteristics. Values in First to Third Examples are plotted as black circles. As apparent from this figure, by the UV light-emitting device according to this embodiment, more favorable characteristics than conventional can be obtained. For example, it can be said that, by using the UV light-emitting device according to this embodi- ment, a single chip sterilization device in the wavelength band in which the sterilizing effect is expected can be put to practical use. As described above, the light-emitting efficiency in the UV light-emitting device using the group III nitride semiconductor can be greatly improved.

Various MOCVD growth techniques can be employed in fabricating the devices described in this application. Crystal growth can be performed at low temperatures of 1000° C. to 1200° C., but the pGaN layer, the AlInGaN layer, and the like can be grown at lower temperatures. In some implementations, an AlGaN bulk single crystal substrate may be used to form UV LED devices.

The devices and techniques described in this application can be applied to construction and fabrication of an UV light-emitting device. Devices and techniques described in this application can be implemented in ways that improve the light-emitting efficiency of an UV light-emitting device using a group III nitride semiconductor. As an x value of an $Al_xGa_{1-x}$ N electron blocking layer (20 nm in thickness) becomes larger (a to c), the EL intensity in the 260 nm band becomes larger. Meanwhile, when the molar ratio of Al is 0.89 (a in FIG. 4), a broad emission peak, that is, the emission peak by a p-AlGaN layer is observed around 290 nm and electron overflow from the MQW occurs. When the molar ratios of Al are 0.97 and 1.0, the EL intensity in the wavelength band is not substantially observed and electron overflow is satisfactorily controlled by using the high electron blocking layer. By providing an Al(Ga)N electron blocking layer with a high Al moral ratio, for example, of 0.95 or more, the external quantum efficiency can be improved and the emission intensity itself can be increased. Thereby, a highly practical favorable values can be obtained.

Figure 17:
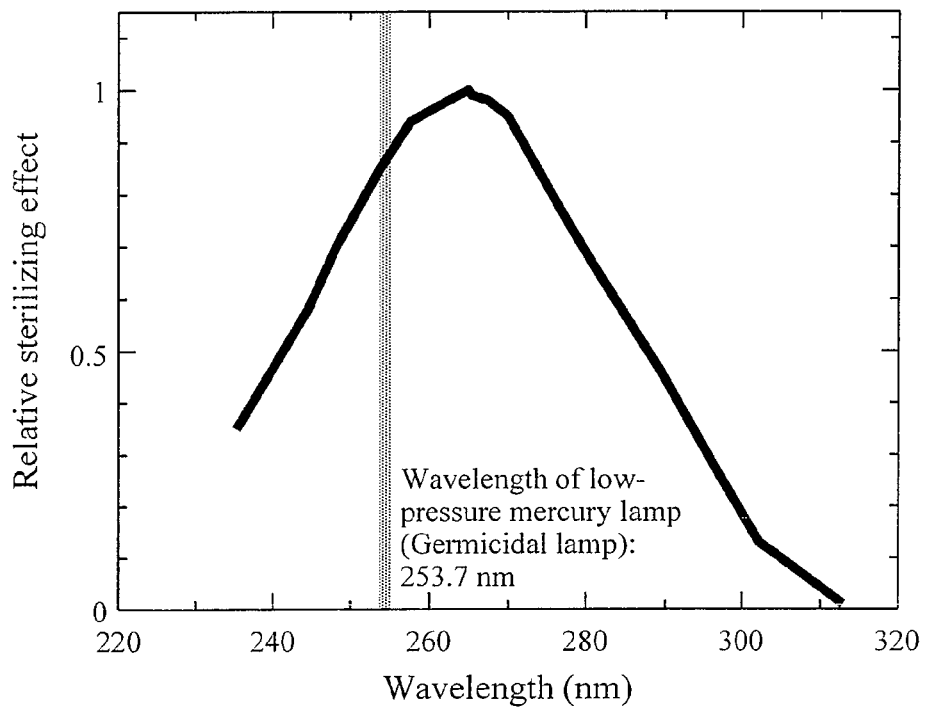
FIG. 17 is a graph showing a wavelength dependence of sterilizing effect.

It is expected that a semiconductor deep UV light source is applied to fields of high-speed decomposition processing of polluting substances, fluorescent lamps of high color rendering and long life, laser for high-density optical recording as well as disinfection and medical fields. FIG. 17 is a graph showing wavelength dependence of a sterilizing effect. For reference, the wavelength (257.7 nm) of a low-pressure mercury lamp (germicidal lamp) is shown. Sterilization is caused by breakdown of DNA (nucleic acid) and this wavelength is substantially the same as the absorption wavelength of DNA. As apparent from FIG. 17, the most effective wavelength for sterilization falls within the range of 260 nm to 280 nm.

Figure 18:
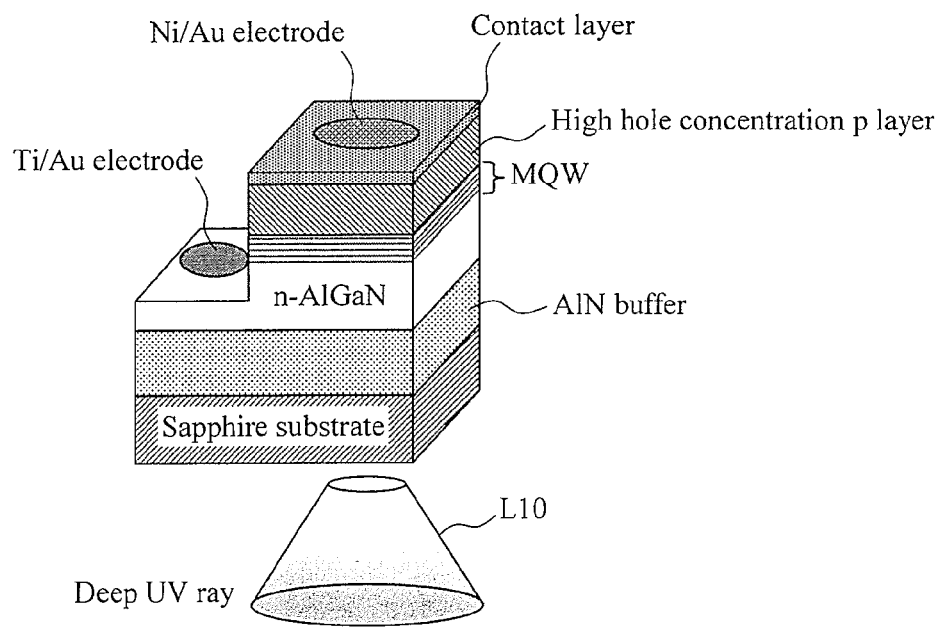
FIG. 18 is a perspective view schematically showing the structure of a deep UV LED using a group III nitride semiconductor.
Figure 19:
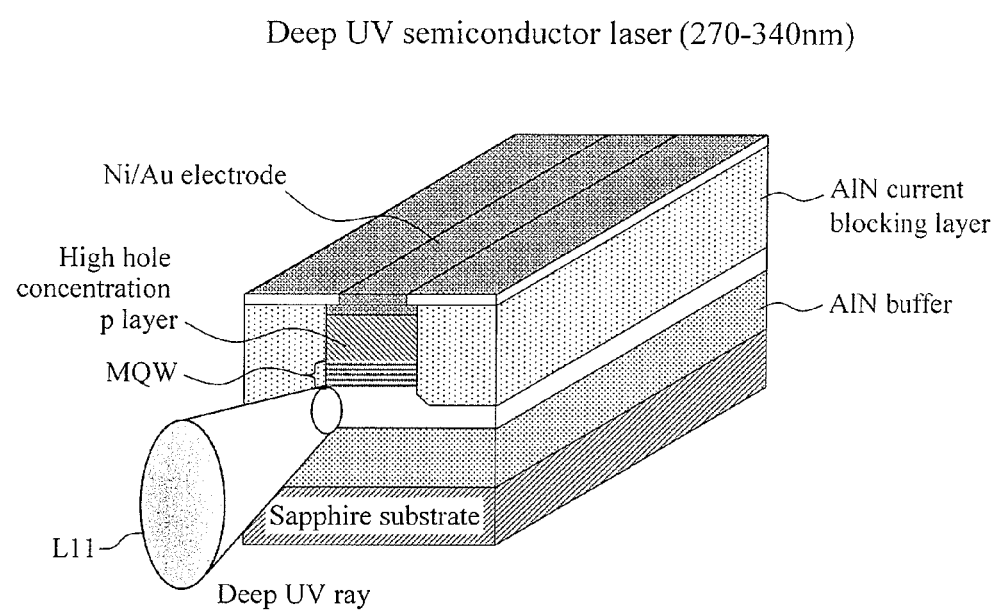
FIG. 19 is a perspective view schematically showing the structure of a deep UV semiconductor laser using a group III nitride semiconductor.

FIG. 18 is a perspective view schematically showing the structure of a deep UV LED using a group III nitride semiconductor. FIG. 19 is a perspective view schematically showing the structure of a deep UV semiconductor laser using a group III nitride semiconductor. As shown in FIG. 18, in the deep UV LED using the group III nitride semiconductor, an AlN buffer layer is formed on a sapphire substrate, and an n-AlGaN contact layer, an InAlGaN quantum well layer (MQW), a p-InAlGaN layer and a p-type contact layer are stacked on the AlN buffer layer in this order. In addition, a Ti-Au electrode is formed on the n-AlGaN contact layer and a Ni—Au electrode is formed in the p-type contact layer. With such structure, the deep UV LED having an emission wavelength of 230 to 350 nm (deep UV light L10 is emitted) can be formed, for example.

As shown in FIG. 19, an n-AlGaN layer, an InAlGaN quantum well layer (MQW) and a p-InAlGaN layer are serially formed on a sapphire substrate and an AlN buffer and a deep UV semiconductor laser beams (270 to 340 nm) (L11) can be emitted from the cross section (L11). The deep-UV light-emitting devices shown in FIG. 18, FIG. 19 are merely examples and, based on what is described in this application, similar or higher-performance devices can be achieved with a characteristic structure using the techniques described in this application.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Thus, particular embodiments have been described. Variations and enhancements of the described embodiments and other embodiments can be made based on what is described and illustrated.

What is claimed is:

1. A light-emitting device formed on an AlN-based group III nitride single crystal comprising:
   a high-concentration n-type group III nitride layer;
   a multi quantum well structure formed of an n-type or i-type group III nitride barrier layer and an n-type or i-type group III nitride well layer;
   an i-type group III nitride final barrier layer;
   a p-type group III nitride layer; and
   an electron blocking layer formed between the i-type group III nitride final barrier layer and the p-type group III nitride layer, the electron blocking layer being formed of a p-type or i-type AlN serving as an energy barrier for electrons from the i-type group III nitride final barrier layer.

2. A light-emitting device formed on a group III nitride single crystal comprising:
   an AlN-based group III nitride regrowth layer;
   a high-concentration n-type AlGaN layer;
   a multi quantum well structure formed of an n-type or i-type $Al_xGa_{1-x}N$ barrier layer and a well layer of an n-type or i-type $Al_yGa_{1-y}N$ layer (x>y);
   an i-type $Al_xGa_{1-x}N$ final barrier layer;
   a p-type $Al_xGa_{1-x}N$ layer; and
   an electron blocking layer formed between the i-type $Al_xGa_{1-x}N$ final barrier layer and the p-type $Al_xGa_{1-x}N$ layer, the electron blocking layer being formed of a p-type or i-type $Al_zGa_{1-z}N$ layer (z>x>y, 0.95<z≦1) serving as an energy barrier for electrons from the i-type $Al_xGa_{1-x}N$ final barrier layer.

3. The light-emitting device according to claim 1, wherein the group III nitride single crystal is a group III nitride single crystal film formed on a substrate.

4. The light-emitting device according to claim 2, wherein the group III nitride single crystal is a group III nitride single crystal film formed on a substrate.

5. The light-emitting device according to claim 2, wherein a thickness of the well layer of the $Al_yGa_{1-y}N$ layer is set to 2 nm or less.

6. The light-emitting device according to claim 1, wherein the group III nitride single crystal is a group III nitride single crystal film formed on a substrate, and wherein a thickness of the well layer of the $Al_yGa_{1-y}N$ layer is set to 2 nm or less.

7. The light-emitting device according to claim 2, wherein the group III nitride single crystal is a group III nitride single crystal film formed on a substrate, and wherein a thickness of the well layer of the $Al_yGa_{1-y}N$ layer is set to 2 nm or less.

8. The light-emitting device according to claim 2, wherein a thickness of the i-type $Al_xGa_{1-x}N$ final barrier layer is set from 2 nm to 10 nm.

9. The light-emitting device according to claim 1, wherein the group III nitride single crystal is a group III nitride single crystal film formed on a substrate, a thickness of the well layer of the $Al_yGa_{1-y}N$ layer is set to 2 nm or less, and a thickness of the i-type $Al_xGa_{1-x}N$ final barrier layer is set from 2 nm to 10 nm.

10. The light-emitting device according to claim 2, wherein the group III nitride single crystal is a group III nitride single crystal film formed on a substrate, a thickness of the well layer of the $Al_yGa_{1-y}N$ layer is set to 2 nm or less, and a thickness of the i-type $Al_xGa_{1-x}N$ final barrier layer is set from 2 nm to 10 nm.

11. The light-emitting device according to claim 2, wherein a thickness of the well layer of the $Al_yGa_{1-y}N$ layer is set to 2 nm or less, and a thickness of the i-type $Al_xGa_{1-x}N$ final barrier layer is set from 2 nm to 10 nm.

12. The light-emitting device according to claim 1, wherein the group III nitride single crystal is a group III nitride single crystal film formed on a substrate, and a thickness of the i-type $Al_xGa_{1-x}N$ final barrier layer is set from 2 nm to 10 nm.

13. The light-emitting device according to claim 2, wherein the group III nitride single crystal is a group III nitride single crystal film formed on a substrate, and a thickness of the i-type $Al_xGa_{1-x}N$ final barrier layer is set from 2 nm to 10 nm.

14. The light-emitting device according to claim 1, wherein a half bandwidth of an XRC in a (10-22) plane of the AlN-based group III nitride single crystal is 400 arcsec or less.

15. The light-emitting device according to claim 2, wherein a half bandwidth of an XRC in a (10-22) plane of the AlN-based group III nitride single crystal is 400 arcsec or less.

16. The light-emitting device according to claim 1, wherein the group III nitride single crystal is a group III nitride single crystal film formed on a substrate, and a half bandwidth of an XRC in a (10-22) plane of the AlN-based group III nitride single crystal is 400 arcsec or less.

17. The light-emitting device according to claim 2, wherein the group III nitride single crystal is a group III nitride single crystal film formed on a substrate, and a half bandwidth of an XRC in a (10-22) plane of the AlN-based group III nitride single crystal is 400 arcsec or less.

18. The light-emitting device according to claim 2, wherein a thickness of the well layer of the $Al_yGa_{1-y}N$ layer is set to 2 nm or less, and a half bandwidth of an XRC in a (10-22) plane of the AlN-based group III nitride single crystal is 400 arcsec or less.

19. The light-emitting device according to claim 2, wherein the group III nitride single crystal is a group III nitride single crystal film formed on a substrate, a thickness of the well layer of the $Al_yGa1-yN$ layer is set to 2 nm or less, and a half bandwidth of an XRC in a (10-22) plane of the AlN-based group III nitride single crystal is 400 arcsec or less.

20. The light-emitting device according to claim 1, wherein the group III nitride single crystal is a group III nitride single crystal film formed on a substrate, a thickness of the well layer of the $Al_yGa_{1-y}N$ layer is set to 2 nm or less, and a half bandwidth of an XRC in a (10-22) plane of the AlN-based group III nitride single crystal is 400 arcsec or less.

21. The light-emitting device according to claim 1, wherein the group III nitride single crystal is a group III nitride single crystal film formed on a substrate, a thickness of the i-type $Al_xGa_{1-x}N$ final barrier layer is set from 2 nm to 10 nm, a half bandwidth of an XRC in a (10-22) plane of the AlN-based group III nitride single crystal is 400 arcsec or less.

22. The light-emitting device according to claim 2, wherein the group III nitride single crystal is a group III nitride single crystal film formed on a substrate, a thickness of the i-type $Al_xGa_{1-x}N$ final barrier layer is set from 2 nm to 10 nm, a half bandwidth of an XRC in a (10-22) plane of the AlN-based group III nitride single crystal is 400 arcsec or less.

23. The light-emitting device according to claim 2, wherein a thickness of the i-type $Al_xGa_{1-x}N$ final barrier layer is set from 2 nm to 10 nm, and a half bandwidth of an XRC in a (10-22) plane of the AlN-based group III nitride single crystal is 400 arcsec or less.

24. The light-emitting device according to claim 2, wherein a thickness of the i-type $Al_xGa_{1-x}N$ final barrier layer is set from 2 nm to 10 nm, a thickness of the well layer of the $Al_yGa_{1-y}N$ layer is set to 2 nm or less, and a half bandwidth of an XRC in a (10-22) plane of the AlN-based group III nitride single crystal is 400 arcsec or less.

25. The light-emitting device according to claim 2, wherein the group III nitride single crystal is a group III nitride single crystal film formed on a substrate, a thickness of the i-type $Al_xGa_{1-x}N$ final barrier layer is set from 2 nm to 10 nm, a thickness of the well layer of the $Al_yGa_{1-y}N$ layer is set to 2 nm or less, and a half bandwidth of an XRC in a (10-22) plane of the AlN-based group III nitride single crystal is 400 arcsec or less.

26. The light-emitting device according to claim 1, wherein the group III nitride single crystal is a group III nitride single crystal film formed on a substrate, a thickness of the i-type $Al_xGa_{1-x}N$ final barrier layer is set from 2 nm to 10 nm, a thickness of the well layer of the $Al_yGa_{1-y}N$ layer is set to 2 nm or less, and a half bandwidth of an XRC in a (10-22) plane of the AlN-based group III nitride single crystal is 400 arcsec or less.

27. A method of growing a light-emitting device structure formed on a group III nitride single crystal, comprising the steps of:
   growing an AlN-based group III nitride regrowth layer on the group III nitride single crystal;
   growing a high-concentration n-type AlGaN layer on the AlN-based group III nitride regrowth layer;
   growing a multi quantum well structure formed of an i-type or n-type doped $Al_xGa_{1-x}N$ barrier layer and a well layer of an n-type or an i-type $Al_yGa_{1-y}N$ layer (x>y);
   growing an undoped $Al_xGa_{1-x}N$;
   growing a p-type $Al_xGa_{1-x}N$ layer on the i-type $Al_xGa_{1-x}N$ layer; and
   growing an electron blocking layer between the i-type $Al_xGa_{1-x}N$ layer and the p-type $Al_xGa_{1-x}N$ layer formed on the i-type $Al_xGa_{1-x}N$ layer, the electron blocking layer being formed of a p-type or i-type $Al_zGa_{1-z}N$ layer (z>x>y, $0.95<z\leq1$) serving as an energy barrier for electrons form the n-type $Al_xGa_{1-x}N$ layer.

28. The method of growing a light-emitting device structure according to 27, wherein each growth is performed at a low temperature of 1000° C. to 1200° C.

29. A method of growing a light-emitting device structure formed on a group III nitride single crystal, comprising the steps of:
   growing a high-concentration n-type AlGaN layer on the AlN-based group III nitride regrowth layer;
   growing a multi quantum well structure formed of an n-type or i-type group III nitride barrier layer and an n-type or i-type group III nitride well layer;
   growing an i-type group III nitride final barrier layer;
   growing a p-type group III nitride layer; and
   growing an electron blocking layer formed between the i-type group III nitride final barrier layer and the p-type group III nitride layer, the electron blocking layer being formed of a p-type or i-type AN layer serving as an energy barrier for electrons from the i-type group III nitride final barrier layer.

* * * * *